(12) United States Patent
Chen

(10) Patent No.: US 9,230,753 B2
(45) Date of Patent: Jan. 5, 2016

(54) ILLUMINATED TOUCH KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 13/919,819

(22) Filed: Jun. 17, 2013

(65) Prior Publication Data

US 2014/0168934 A1 Jun. 19, 2014

(30) Foreign Application Priority Data

Dec. 19, 2012 (TW) ............... 101148410 A

(51) Int. Cl.
*H01H 13/83* (2006.01)
(52) U.S. Cl.
CPC ......... *H01H 13/83* (2013.01); *H01H 2219/014* (2013.01); *H01H 2219/06* (2013.01); *H01H 2219/062* (2013.01); *H03K 2217/96046* (2013.01)
(58) Field of Classification Search
CPC . G06F 3/0202; H04M 1/22; H01H 2219/062; H01H 13/702; H01H 13/83; H01H 2219/056; G02B 6/0021; G01D 11/28
USPC ............................................ 362/23.03–23.06
See application file for complete search history.

(56) References Cited

U.S. PATENT DOCUMENTS

| | | | |
|---|---|---|---|
| 5,908,721 A * | 6/1999 | Emoto et al. | 430/7 |
| 8,148,657 B2 * | 4/2012 | Keist | 200/512 |
| 2003/0122980 A1 * | 7/2003 | Jin et al. | 349/43 |
| 2005/0124184 A1 * | 6/2005 | Hubert | 439/66 |
| 2009/0115732 A1 * | 5/2009 | Tao et al. | 345/168 |
| 2009/0121904 A1 * | 5/2009 | Liu et al. | 341/22 |
| 2009/0160321 A1 * | 6/2009 | Verjans | 313/504 |
| 2009/0260965 A1 * | 10/2009 | Chang | 200/314 |
| 2010/0214635 A1 * | 8/2010 | Sasaki et al. | 359/15 |
| 2011/0170105 A1 * | 7/2011 | Cui et al. | 356/450 |
| 2012/0139843 A1 * | 6/2012 | Shipman et al. | 345/170 |
| 2013/0121017 A1 * | 5/2013 | Tsai | 362/602 |

* cited by examiner

*Primary Examiner* — Jong-Suk (James) Lee
*Assistant Examiner* — Mark Tsidulko
(74) *Attorney, Agent, or Firm* — Kirton McConkie; Evan R. Witt

(57) ABSTRACT

An illuminated touch keyboard includes a light source, a key structure, and a non-contact sensor board. The non-contact sensor board is used for sensing a depressing action of the key structure. The non-contact sensor board includes a light-shading plate, a light guide plate, and a reflecting plate. The light-shading plate includes a first wiring layer. The reflecting plate includes a second wiring layer. Since the light-shading plate, the light guide plate and the reflecting plate are include in the non-contact sensor board, the fabricating cost of the illuminated touch keyboard is reduced, and the overall height of the illuminated touch keyboard is decreased.

11 Claims, 3 Drawing Sheets

ILLUMINATED TOUCH KEYBOARD

FIELD OF THE INVENTION

The present invention relates to a touch keyboard, and more particularly to an illuminated touch keyboard.

BACKGROUND OF THE INVENTION

For allowing users to operate keyboards in a dark or dim environment, some keyboards with light sources such as light emitting diodes (LED) have been introduced into the market. The light sources may provide light beams to illuminate the keyboards. The keyboards with the illuminating functions are also referred as illuminated keyboards. By using the illuminated keyboards, the users can easily identify the characters or the symbols marked on the keys of the illuminated keyboards.

FIG. 1 is a schematic view illustrating a conventional illuminated keyboard. As shown in FIG. 1, the conventional illuminated keyboard 10 comprises a key structure 11, a membrane switch board 12, a backlight module 13, and a bottom plate 14. The membrane switch board 12 comprises an upper wiring plate 15, a lower wiring plate 16, and a partition plate 17. The backlight module 13 comprises a light-shading plate 18, a light guide plate 19, a reflecting plate 20, and a light source L.

The key structure 11 is disposed over the membrane switch board 12 to be depressed by the user. When the key structure 11 is depressed, the membrane switch board 12 is electrically conducted to generate a key signal. The detailed structures of the membrane switch board 12 will be illustrated as follows.

In the membrane switch board 12, the upper wiring plate 15 comprises an upper circuit layer 151, and the lower wiring plate 16 comprises a lower circuit layer 161. The upper circuit layer 151 and the lower circuit layer 161 are circuit patterns that are made of an electrically-conductive material. The upper wiring plate 15 is disposed over the lower wiring plate 16. The partition plate 17 comprises plural perforations 171. Moreover, the partition plate 17 is arranged between the upper wiring plate 15 and the lower wiring plate 16 for preventing erroneous contact between the upper wiring plate 15 and the lower wiring plate 16.

As the key structure 11 is depressed, the upper wiring plate 15 is subjected to deformation. Consequently, the upper circuit layer 151 of the upper wiring plate 15 is penetrated through the corresponding perforation 171 of the partition plate 17, and the upper circuit layer 151 of the upper wiring plate 15 is contacted with the lower circuit layer 161 of the lower wiring plate 16. Under this circumstance, the electrical connection between the upper circuit layer 151 and the lower circuit layer 161 results in the key signal.

The backlight module 13 is disposed under the membrane switch board 12 for illuminating the key structure 11. The backlight module 13 comprises the light-shading plate 18, the light guide plate 19, the reflecting plate 20, and the light source L. The light guide plate 19 is located at a side of the light source L for transferring the light beam, which is emitted by the light source L. The reflecting plate 20 is disposed under the light guide plate 19 for reflecting the light beam to the light guide plate 19, thereby increasing the light utilization efficacy of the light source L. The light-shading plate 18 is disposed over the light guide plate 19. Moreover, the light-shading plate 18 comprises a light-transmissible region A and an opaque region B. The light beam is allowed to be transmitted through the light-transmissible region A of the light-shading plate 18. The opaque region B of the light-shading plate 18 is used for shading the light beam in order to prevent the light beam from being transmitted to any place where the light beam is not needed. Consequently, the light leakage problem can be eliminated. The bottom plate 14 is disposed under the backlight module 13 for supporting the key structure 11, the membrane switch board 12 and the backlight module 13.

By means of the light guide plate 19, the reflecting plate 20 and the light-shading plate 18 of the backlight module 13, the light beam from the light source L can be uniformly transferred to each key structure 14. Consequently, the illuminated keyboard 10 has the backlighting function, the number of the light sources L is reduced, and the light leakage from the key structure 11 will be minimized. Under this circumstance, the illuminated keyboard 10 is cost-effective and aesthetically pleasing. However, the conventional illuminated keyboard 10 still has some drawbacks. For example, due to the thicknesses of the light-shading plate 18, the light guide plate 19 and the reflecting plate 20, the arrangement of the backlight module 13 under the membrane switch board 12 may increase the overall height of the illuminated keyboard 10. Consequently, it is difficult to further reduce the thickness of the illuminated keyboard 10.

Therefore, there is a need of providing an improved illuminated keyboard in order to eliminate the above drawbacks.

SUMMARY OF THE INVENTION

The present invention provides a slim-type illuminated touch keyboard.

In accordance with an aspect of the present invention, there is provided an illuminated touch keyboard. The illuminated touch keyboard includes a light source, a key structure, and a non-contact sensor board. The light source is used for emitting a light beam. When the key structure is depressed, a key signal is correspondingly triggered. The non-contact sensor board is disposed under the key structure for sensing a depressing action of the key structure, thereby generating the key signal. The non-contact sensor board includes a light-shading plate, a light guide plate, and a reflecting plate. The light-shading plate includes a first wiring layer and plural light-transmissible regions. The first wiring layer is formed on a first surface of the light-shading plate, and the light beam is transmissible through the plural light-transmissible regions. The light guide plate is disposed under the light-shading plate for transferring the light beam, which is emitted by the light source. The reflecting plate is disposed under the light guide plate for reflecting the light beam. The reflecting plate includes a second wiring layer, and the second wiring layer is formed on a second surface of the reflecting plate.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
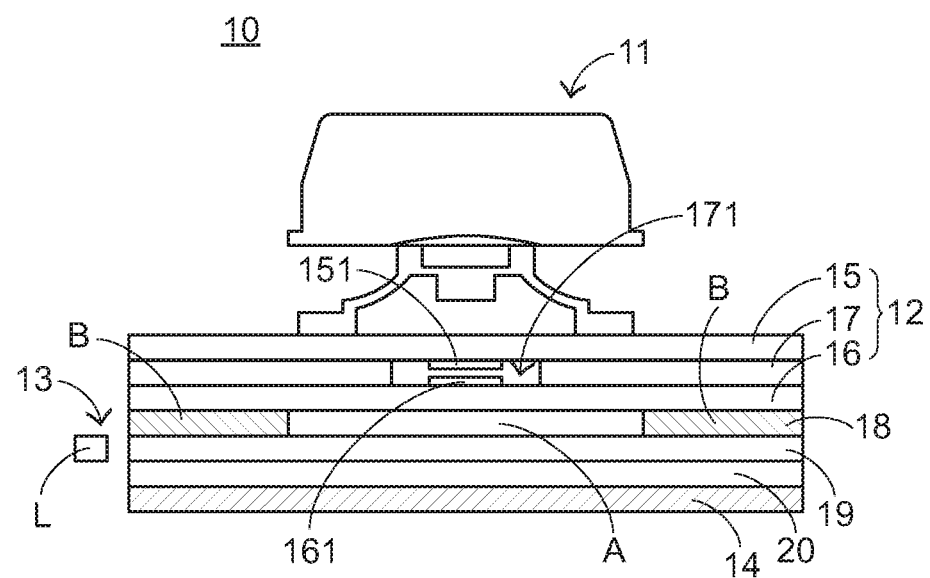
FIG. 1 is a schematic view illustrating a conventional illuminated keyboard.
Figure 2:
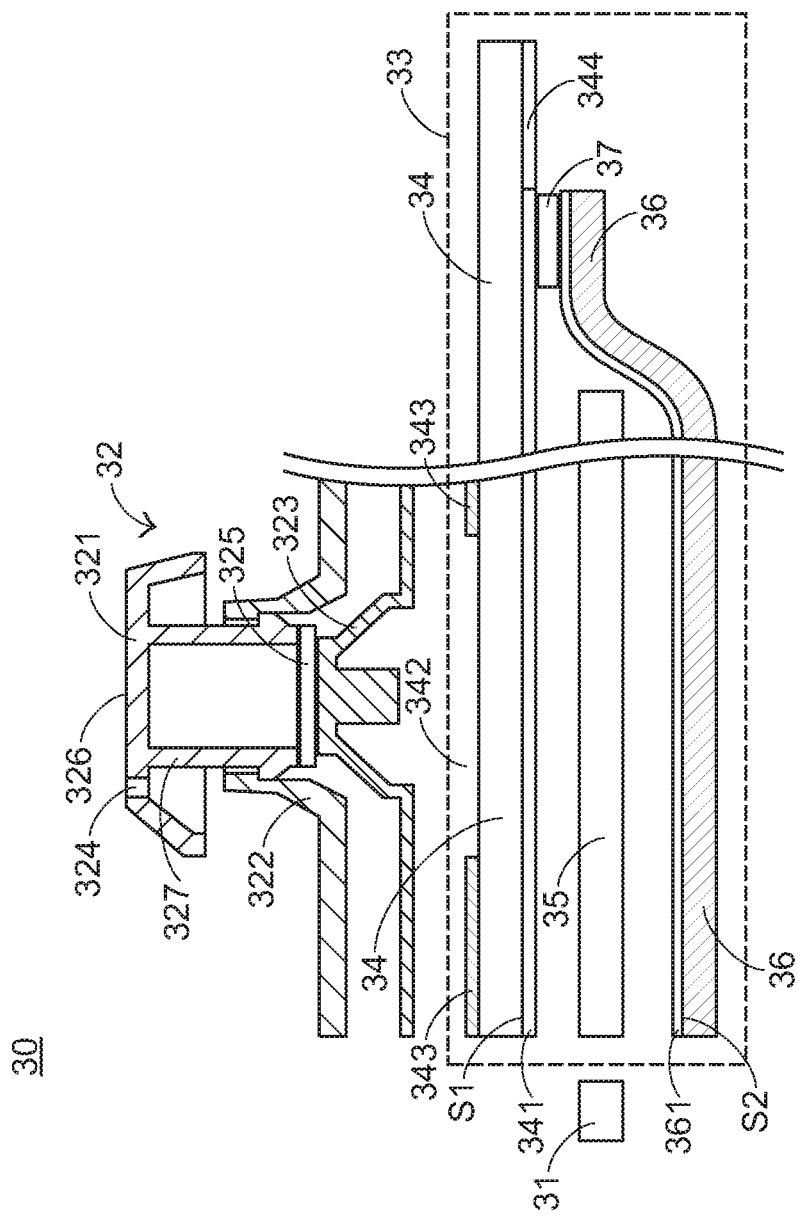
FIG. 2 is a schematic view illustrating an illuminated touch keyboard according to a first embodiment of the present invention.

FIG. 2 is a schematic view illustrating an illuminated touch keyboard according to a first embodiment of the present invention. As shown in FIG. 2, the illuminated touch keyboard 30 comprises a light source 31, a key structure 32, a non-contact sensor board 33, and a conductive adhesive layer 37.

The light source 31 is located at a side of the non-contact sensor board 33 for emitting a light beam and providing the light beam to the key structure 32. In this embodiment, the light source 31 comprises one or more light emitting diodes (LED), but is not limited thereto. The key structure 32 is used for triggering a key signal in response to a depressing action. That is, when the key structure 32 is depressed, the key signal is correspondingly triggered. Moreover, the non-contact sensor board 33 is disposed under the key structure 32 for sensing the depressing action of the key structure 32, thereby generating the key signal.

The key structure 32 may be a plunger key structure, a scissors key structure or any other key structure that is known in the art. In this embodiment, the key structure 32 is a plunger key structure. The key structure 32 comprises a keycap 321, a key base 322, an elastic element 323, a light-outputting part 324, and a conductive element 325. The keycap 321 comprises a pressing part 326 and a plunger part 327.

The pressing part 326 is disposed on a top surface of the keycap 321 to be depressed by the user. The plunger part 327 is connected with the pressing part 326. In addition, the plunger part 327 and the pressing part 326 are linked with each other. The plunger part 327 is disposed within the key base 322, and the plunger part 327 is movable upwardly or downwardly relative to the key base 322. The elastic element 323 is disposed under the plunger part 327. Especially, the elastic element 323 is arranged between the plunger part 327 and the non-contact sensor board 33 for providing a restoring force. In response to the restoring force, the keycap 321 is returned to its original position.

The conductive element 325 is located at an end of the plunger part 327. In this embodiment, the conductive element 325 is a conductive foam structure or a metallic paint film, but is not limited thereto. The light-outputting part 324 is formed on the keycap 321 for outputting the light beam, thereby facilitating the user to identify the key structure 32. Moreover, the light-outputting part 324 is a light-outputting number region, a light-outputting character region or a light-outputting symbol region. The method of forming the light-outputting part 324 is similar to the method of forming the light-outputting part of the conventional illuminated keyboard, and is not redundantly described herein.

The non-contact sensor board 33 is a touch-sensitive sensor board that is enabled in a non-contact manner without the contact between adjacent circuit layers. For example, the non-contact sensor board 33 is a capacitive sensor board or a magnetic sensor board, which is known in the art. In this embodiment, the non-contact sensor board 33 is a capacitive sensor board, but is not limited thereto.

The non-contact sensor board 33 comprises a light-shading plate 34, a light guide plate 35, and a reflecting plate 36. The light-shading plate 34 is used for shading the light beam in order to prevent the light beam from being transmitted to any place where the light beam is not needed. Consequently, the light leakage problem can be eliminated. The light guide plate 35 is disposed under the light-shading plate 34 and located at a side of the light source 31 for transferring the light beam, which is emitted by the light source 31. The reflecting plate 36 is disposed under the light-shading plate 35 for reflecting the light beam, which is emitted by the light source 31.

The light-shading plate 34 comprises a first wiring layer 341, plural light-transmissible regions 342, a light-shading ink layer 343, and a pin 344. The reflecting plate 36 comprises a second wiring layer 361. The light-shading ink layer 343 is disposed on the light-shading plate 34 for shading the light beam. The plural light-transmissible regions 342 are formed in the light-shading plate 34. The light beam is transmissible through the plural light-transmissible regions 342, and directed to the key structure 32.

The first wiring layer 341 is formed on a first surface S1 of the light-shading plate 34. The second wiring layer 361 is formed on a second surface S2 of the reflecting plate 36. The pin 344 is disposed on the light-shading plate 34, but is not limited thereto. The pin 344 is electrically connected with the first wiring layer 341 and the second wiring layer 361. Moreover, the pin 344 electrically connected with a power source (not shown), and the key signal is outputted from the pin 344.

Moreover, the first surface S1 of the light-shading plate 34 may be a top surface or a bottom surface of the light-shading plate 34, and the second surface S2 of the reflecting plate 36 may be a top surface or a bottom surface of the reflecting plate 36. In this embodiment, the first wiring layer 341 is formed on the bottom surface of the light-shading plate 34, and the second wiring layer 361 is formed on the top surface of the reflecting plate 36. In addition, the first wiring layer 341 and the second wiring layer 361 are electrically connected with each other through the conductive adhesive layer 37.

The conductive adhesive layer 37 is arranged between the light-shading plate 34 and the light guide plate 35. In this embodiment, the conductive adhesive layer 37 is located at a side of the light-shading plate 34 and a side of the light guide plate 35. The position of the conductive adhesive layer 37 is presented herein for purpose of illustration and description only. Alternatively, in some other embodiments, the conductive adhesive layer 37 may be located at any position between the light-shading plate 34 and the light guide plate 35. An example of the conductive adhesive layer 37 includes but is not limited to an anisotropic conductive film (ACF) or an anisotropic conductive paste (ACP).

The first wiring layer 341 and the second wiring layer 361 may be electrically connected to electrodes with opposite polarities, respectively. For example, the first wiring layer 341 is electrically connected to a positive electrode (not shown), and the second wiring layer 361 is electrically connected to a negative electrode (not shown). Moreover, the distribution of the electric field between the first wiring layer 341 and the second wiring layer 361 may result in a coupling capacitance.

The structures and the functions of the light-shading plate 34 are similar to those of the conventional light-shading plate. The light-shading plate 34 will be illustrated in more details as follows. The light-shading plate 34 is a light-transmissible substrate, wherein the light-shading ink layer 343 is partially coated on a top surface or a bottom surface of the light-shading plate 34 for shading the light beam. Since the light beam can be transmitted through the region of the light-shading plate 34 uncovered by the light-shading ink layer 343, the region of the light-shading plate 34 uncovered by the light-shading ink layer 343 is the light-transmissible region 342 of the light-shading plate 34.

It is noted that the way of forming the plural light-transmissible regions 342 are not restricted. In some other embodiments, the light-shading plate 34 is a light-transmissible substrate, and the light-shading ink layer 343 is completely coated on a top surface or a bottom surface of the light-shading plate 34. For allowing the light beam to be transmitted through the light-shading plate 34 to illuminate the key structure 32, the light-shading plate 34 comprises plural openings (not shown). The plural openings run through the light-shading plate 34. Moreover, the plural openings are aligned with the key structure 32. Since the openings are not covered by the light-shading ink layer 343, the light beam can be transmitted through the light-shading plate 34. In other words, the openings of the light-shading plate 34 may be considered as the light-transmissible regions 342 of the light-shading plate 34.

In an embodiment, the light-transmissible substrate of the light-shading plate 34 is made of a light-transmissible material such as polymethylmethacrylate (PMMA), polycarbonate (PC) or polyethylene terephthalate (PET). Moreover, the light-shading ink layer 343 is made of black ink, but is not limited thereto.

The structures and the functions of the reflecting plate 36 are similar to those of the conventional reflecting plate. The reflecting plate 36 is made of an opaque material. The reflecting plate 36 is used for reflecting the portion of the light beam that is transmitted through the light guide plate 35. Consequently, the light utilization efficacy of the light source 31 is enhanced.

If the light beam transferred within the light guide plate 35 is shaded by the first wiring layer 341 and the second wiring layer 361, the luminous efficacy of the illuminated touch keyboard 30 will be deteriorated. For enhancing the luminous efficacy, the electrode patterns of the first wiring layer 341 and the second wiring layer 361 may be made of a transparent conductive material. An example of the transparent conductive material includes but is not limited to indium tin oxide (ITO), nano silver, nano copper, carbon nanotube, or graphene. Moreover, the first wiring layer 341 and the second wiring layer 361 may be formed by a printing process, a spraying process or an electroplating process, but are not limited thereto.

As the pressing part 326 of the key structure 32 is depressed by the user, the key structure 32 is moved toward the non-contact sensor board 33. Correspondingly, the conductive element 325 at the end of the plunger part 327 is moved to a position near the non-contact sensor board 33. Under this circumstance, the distribution of the electric field between the first wiring layer 341 and the second wiring layer 361 is changed, and thus a capacitance value between the first wiring layer 341 and the second wiring layer 361 is changed. Due to the change of the capacitance value, the conductive element 325 is sensed by the non-contact sensor board 33, and a corresponding key signal is generated by the non-contact sensor board 33. The sensing principles and the coordinate calculating ways of the non-contact sensor board 33 are similar to those of the conventional capacitive sensor board, and are not redundantly described herein.

Figure 3:
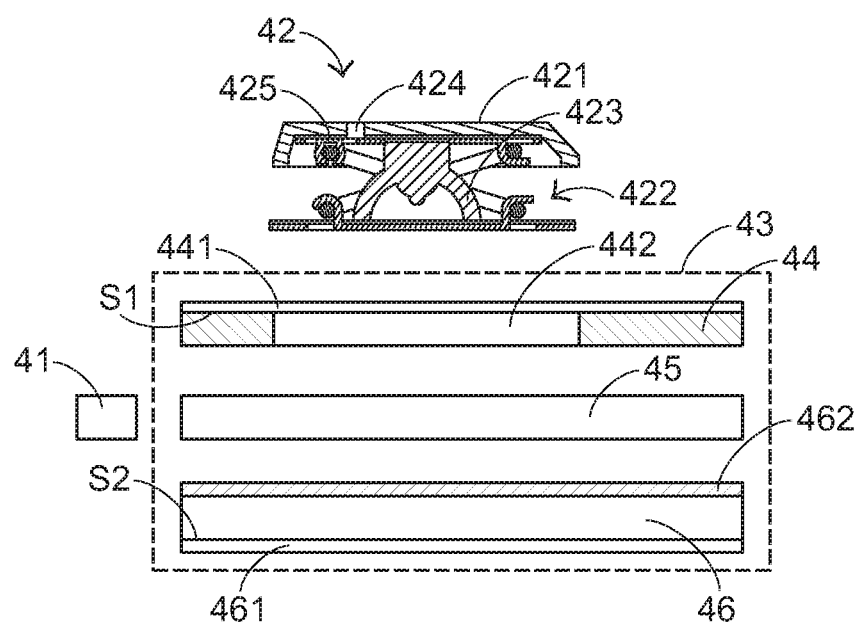
FIG. 3 is a schematic view illustrating an illuminated touch keyboard according to a second embodiment of the present invention.

FIG. 3 is a schematic view illustrating an illuminated touch keyboard according to a second embodiment of the present invention. As shown in FIG. 3, the illuminated touch keyboard 40 comprises a light source 41, a key structure 42, and a non-contact sensor board 43. The non-contact sensor board 43 comprises a light-shading plate 44, a light guide plate 45, and a reflecting plate 46.

The light source 41 is located at a side of the non-contact sensor board 43 for emitting a light beam and providing the light beam to the key structure 42. In this embodiment, the light source 41 comprises one or more light emitting diodes (LED), but is not limited thereto. The key structure 42 is used for triggering a key signal in response to a depressing action. That is, when the key structure 42 is depressed, the key signal is correspondingly triggered. Moreover, the non-contact sensor board 43 is disposed under the key structure 42 for sensing the depressing action of the key structure 42, thereby generating the key signal.

The light-shading plate 44 is used for shading the light beam in order to prevent the light beam from being transmitted to any place where the light beam is not needed. Consequently, the light leakage problem can be eliminated. The light guide plate 45 is disposed under the light-shading plate 44 and located at a side of the light source 41 for transferring the light beam, which is emitted by the light source 31. The reflecting plate 46 is disposed under the light-shading plate 45 for reflecting the light beam, which is emitted by the light source 41.

Except for the key structure 42, the positions of the wiring layers of the non-contact sensor board 43 and the structure of the light-shading plate 44 and reflecting plate 46, the other components of the illuminated touch keyboard 40 are similar to those of the illuminated touch keyboard of the first embodiment (see FIG. 2), and are not redundantly described herein.

In the illuminated touch keyboard 40 of the second embodiment, the key structure 42 is a scissors key structure. The key structure 42 comprises a keycap 421, a scissors-type supporting structure 422, an elastic element 423, a light-outputting part 424, and a conductive element 425.

The scissors-type supporting structure 422 is disposed under the keycap 421 for supporting the keycap 421. The elastic element 423 is disposed under the keycap 423. Especially, the elastic element 423 is arranged between the keycap 421 and the non-contact sensor board 43 for providing a restoring force. In response to the restoring force, the keycap 421 is returned to its original position.

The conductive element 425 is disposed on a bottom surface of the keycap 421. In this embodiment, the conductive element 425 is a conductive foam structure or a metallic paint film, but is not limited thereto. The light-outputting part 424 is formed on the keycap 421 for outputting the light beam, thereby facilitating the user to identify the key structure 42. Moreover, the light-outputting part 424 is a light-outputting number region, a light-outputting character region or a light-outputting symbol region. The method of forming the light-outputting part 424 is similar to the method of forming the light-outputting part of the conventional illuminated keyboard, and is not redundantly described herein.

The light-shading plate 44 of the non-contact sensor board 43 comprises a first wiring layer 441 and plural light-transmissible regions 442. The first wiring layer 441 is formed on a first surface S1 of the light-shading plate 44. In this embodiment, the first wiring layer 441 is formed on a top surface of the light-shading plate 44, and the light-shading plate 44 is made of an opaque material.

For allowing the light beam to be transmitted through the light-shading plate 44 to illuminate the key structure 42, the light-shading plate 44 further comprises plural openings (not shown). The plural openings run through the light-shading plate 44. Moreover, the plural openings are aligned with the key structure 42. Since the light beam can be transmitted through the light-shading plate 44, the light-shading plate 44 may be considered as the light-transmissible regions 442 of the light-shading plate 44.

The reflecting plate 46 comprises a second wiring layer 461 and a reflective layer 462. The second wiring layer 461 is formed on a second surface S2 of the reflecting plate 46. In this embodiment, the second wiring layer 461 is formed on a bottom surface of the reflecting plate 46. Moreover, the second wiring layer 461 is electrically connected with the first wiring layer 441. The reflective layer 462 is disposed on the reflecting plate 46 for reflecting the portion of the light beam that is transmitted through the light guide plate 45. Consequently, the light utilization efficacy of the light source 41 is enhanced. Moreover, the reflective layer 462 may be a white ink layer, but is not limited thereto.

As the keycap 421 of the key structure 42 is depressed by the user, the key structure 42 is moved toward the non-contact sensor board 43. Correspondingly, the conductive element 425 on the bottom surface of the keycap 421 is moved to a position near the non-contact sensor board 43. Under this circumstance, the distribution of the electric field between the first wiring layer 441 and the second wiring layer 461 is changed, and thus a capacitance value between the first wiring layer 441 and the second wiring layer 461 is changed. Due to the change of the capacitance value, the conductive element 425 is sensed by the non-contact sensor board 43, and a corresponding key signal is generated by the non-contact sensor board 43. The sensing principles and the coordinate calculating ways of the non-contact sensor board 43 are similar to those of the conventional capacitive sensor board, and are not redundantly described herein.

From the above descriptions, the illuminated touch keyboard comprises a light source, a key structure, and a non-contact sensor board. The non-contact sensor board comprises a light-shading plate, a light guide plate, and a reflecting plate. In the non-contact sensor board of the illuminated touch keyboard of the present invention, a first wiring layer and a second wiring layer are formed on the light-shading plate and the reflecting plate, respectively. Consequently, it not necessary to install an additional light-shading plate, an additional light guide plate and an additional reflecting plate over or under the non-contact sensor board. Under this circumstance, the fabricating cost of the illuminated touch keyboard is reduced, and the overall height of the illuminated touch keyboard is decreased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An illuminated touch keyboard, comprising:
   a light source for emitting a light beam;
   a key structure, wherein when said key structure is depressed, a key signal is correspondingly triggered; and
   a non-contact sensor board disposed under said key structure for sensing a depressing action of said key structure, thereby generating said key signal, wherein said non-contact sensor board comprises:
      a light-shading plate comprising a first wiring layer and plural light-transmissible regions, wherein said first wiring layer is formed on a first surface of said light-shading plate, and said light beam is transmissible through said plural light-transmissible regions;
      a light guide plate disposed under said light-shading plate for transferring said light beam, which is emitted by said light source;
      a reflecting plate disposed under said light guide plate for reflecting said light beam, wherein said reflecting plate comprises a second wiring layer, and said second wiring layer is formed on a second surface of said reflecting plate; and
      a pin electrically connected with said first wiring layer of said light-shading plate and said second wiring layer of said reflecting plate.

2. The illuminated touch keyboard according to claim 1, wherein said non-contact sensor board is a capacitive sensor board.

3. The illuminated touch keyboard according to claim 1, wherein said first surface of said light-shading plate is a top surface or a bottom surface of said light-shading plate, and said second surface of said reflecting plate is a top surface or a bottom surface of said reflecting plate.

4. The illuminated touch keyboard according to claim 1, wherein said light-shading plate is a light-transmissible substrate with a light-shading ink layer.

5. The illuminated touch keyboard according to claim 1, wherein said light-shading plate is made of an opaque material, and said plural light-transmissible regions are openings.

6. The illuminated touch keyboard according to claim 1, wherein said plural light-transmissible regions are openings.

7. The illuminated touch keyboard according to claim 1, wherein said reflecting plate is a light-transmissible substrate with a reflective layer.

8. The illuminated touch keyboard according to claim 1, wherein said reflecting plate is made of an opaque material.

9. The illuminated touch keyboard according to claim 1, wherein said key structure comprises:
   a keycap comprising a pressing part and a plunger part;
   a light-outputting part for allowing said light beam to be outputted;
   a key base for placing said plunger part of said keycap thereon;
   a conductive element located at an end of said plunger part, wherein as said key structure is moved toward said non-contact sensor board, said conductive element is sensed by said non-contact sensor board, so that said key signal is generated by said non-contact sensor board, wherein said conductive element is a conductive foam structure or a metallic paint film; and
   an elastic element disposed under said plunger part for allowing said keycap to be returned to an original position.

10. The illuminated touch keyboard according to claim 1, wherein said key structure comprises:
    a keycap;
    a light-outputting part for allowing said light beam to be outputted;
    a scissors-type supporting structure for supporting said keycap;
    a conductive element disposed on a bottom surface of said keycap, wherein as said key structure is moved toward said non-contact sensor board, said conductive element is sensed by said non-contact sensor board, so that said key signal is generated by said non-contact sensor board, wherein said conductive element is a conductive foam structure or a metallic paint film; and
    an elastic element disposed under said keycap for allowing said keycap to be returned to an original position.

11. The illuminated touch keyboard according to claim 1, wherein said pin is disposed on said light-shading plate.

* * * * *